(12) United States Patent
Kishino et al.

(10) Patent No.: US 8,389,982 B2
(45) Date of Patent: Mar. 5, 2013

(54) ORGANIC EL ELEMENT

(75) Inventors: Kengo Kishino, Tokyo (JP); Jun Kamatani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 361 days.

(21) Appl. No.: 12/882,069

(22) Filed: Sep. 14, 2010

(65) Prior Publication Data

US 2011/0062425 A1   Mar. 17, 2011

(30) Foreign Application Priority Data

Sep. 17, 2009   (JP) ................................ 2009-215403

(51) Int. Cl.
*H01L 35/24* (2006.01)

(52) U.S. Cl. .................................. 257/40; 257/E51.001

(58) Field of Classification Search .................... 257/40, 257/E51.001
See application file for complete search history.

(56) References Cited

U.S. PATENT DOCUMENTS 6,893,743 B2   5/2005   Sato

*Primary Examiner* — Anthony Ho
(74) *Attorney, Agent, or Firm* — Canon U.S.A., Inc., IP Division

(57) ABSTRACT

An organic EL element includes an anode and a cathode, and an organic compound layer between the anode and the cathode, the organic compound layer including a light-emitting sublayer, wherein the light-emitting sublayer contains a host, a metal complex acting as a first dopant, and a metal complex acting as a second dopant, the metal complex acting as the first dopant includes an unconjugated ligand and a conjugated ligand, and the first dopant has the lowest excited triplet level originating from the lowest excited triplet level of a unconjugated ligand.

4 Claims, 1 Drawing Sheet

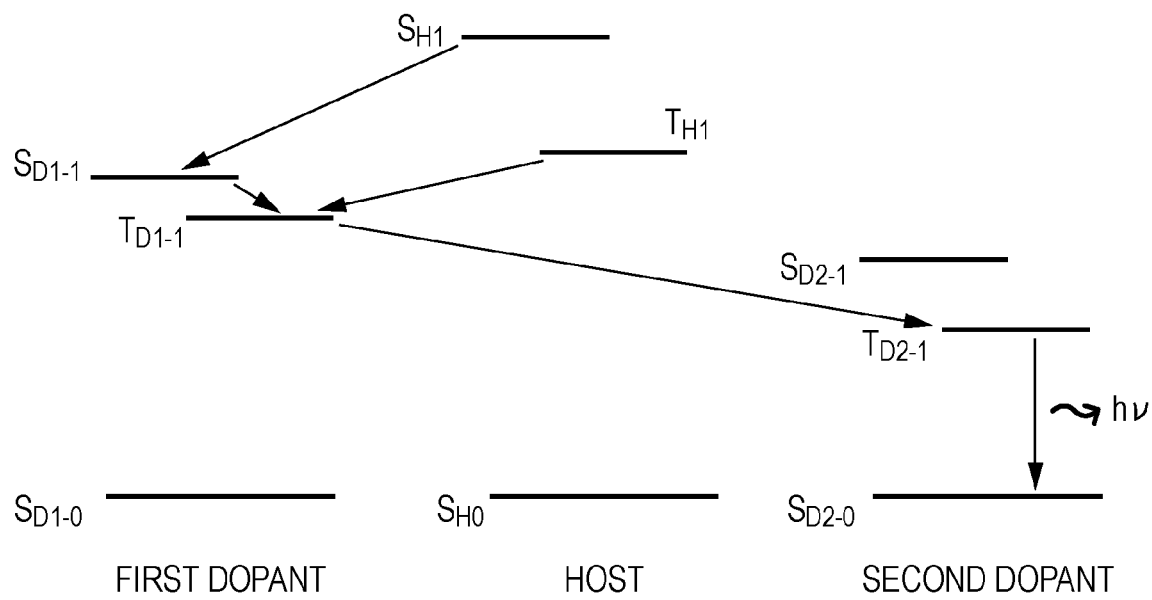

ORGANIC EL ELEMENT

BACKGROUND OF THE INVENTION

1. Field of the Invention

The present invention relates to an organic EL element.

2. Description of the Related Art

Organic electroluminescent (EL) elements include an organic compound layer between a pair of electrodes. The organic compound layer includes one or more sublayers, including a light-emitting sublayer, an optional charge-injection sublayer, and an optional charge-transport sublayer.

In recent years, research and development of various organic EL elements have advanced. One task to be accomplished in the research and development is an improvement in the luminous efficiency of elements. In order to improve the luminous efficiency of elements, use of phosphorescent material instead of fluorescent material has been investigated. Theoretically, use of phosphorescent material, that is, light emission from a triplet excited state is expected to increase luminous efficiency to approximately three times the luminous efficiency of an element utilizing fluorescent material (singlet).

U.S. Pat. No. 6,893,743 discloses an organic EL element that includes three materials (a host, a phosphorescent material A, and a phosphorescent material B) in a light-emitting layer. This organic EL element utilizes energy transfer between the three materials in the light-emitting layer to improve the luminous efficiency of the element.

Two of the phosphorescent materials of the organic EL element according to Patent Document 1 emit phosphorescence at room temperature. In order to emit the light that is attributed to material B, the amounts of the phosphorescent materials in the light-emitting sublayer must be limited. Because the emission quantum efficiencies of the two phosphorescent materials vary with temperature, the luminescent colors at a high temperature and a low temperature may differ from each other.

SUMMARY OF THE INVENTION

The present invention solves the problems described above by providing an organic EL element that allows a wider choice of a host and that can reduce the temperature dependence of color.

An organic EL element according to one aspect of the present invention includes an anode and a cathode, and an organic compound layer between the anode and the cathode, the organic compound layer including a light-emitting sublayer, wherein the light-emitting sublayer contains a host, a metal complex acting as a first dopant, and a metal complex acting as a second dopant, the metal complex acting as the first dopant includes an unconjugated ligand and a conjugated ligand, and the first dopant has the lowest excited triplet level originating from the lowest excited triplet level of an unconjugated ligand.

Further features of the present invention will become apparent from the following description of exemplary embodiments with reference to the attached drawing.

BRIEF DESCRIPTION OF THE DRAWING

FIGURE is a schematic view illustrating the relationship between the lowest excited levels of materials contained in a light-emitting sublayer.

DESCRIPTION OF THE EMBODIMENTS

An organic EL element according to one embodiment of the present invention includes an anode and a cathode, and an organic compound layer between the anode and the cathode. The organic compound layer includes a light-emitting sublayer. A first dopant in the light-emitting sublayer is a metal complex that includes an unconjugated ligand. The first dopant has the lowest excited triplet level originating from the lowest excited triplet level of an unconjugated ligand. Thus, in addition to effective utilization of energy transfer between the first dopant and a second dopant, this can reduce the light emission of the first dopant to widen the concentration limits of the first dopant. Thus, the present invention provides an organic EL element that allows a wider choice of a host and that can reduce the temperature dependence of color.

Organic EL elements according to embodiments of the present invention will be described below. An organic EL element according to an embodiment of the present invention includes a transparent electrode, a hole-transport sublayer, a light-emitting sublayer, an electron-transport sublayer, and a metal electrode stacked on a transparent substrate in this order. The organic EL element may further include an exciton-blocking sublayer between the light-emitting sublayer and the electron-transport sublayer. The hole-transport sublayer may be composed of a single layer or a plurality of layers. The electron-transport sublayer may also be composed of a single layer or a plurality of layers. Embodiments of the present invention are not limited to these embodiments.

In accordance with one embodiment of the present invention, the light-emitting sublayer contains a host, a metal complex acting as a first dopant, and a metal complex acting as a second dopant.

The light-emitting sublayer of the organic compound layer disposed between the anode and the cathode is a layer having a light-emitting function. The term "host", as used herein, refers to the main component of the light-emitting sublayer, the amount of which in the light-emitting sublayer is at least 50% by weight. The term "dopant", as used herein, refers to an accessory component in the light-emitting sublayer, the amount of which in the light-emitting sublayer is less than 50% by weight. The total amount of the first dopant and the second dopant in the light-emitting sublayer is less than 50% by weight.

The host in the light-emitting sublayer can be, but is not limited to, an aromatic compound having a long conjugation length in which benzene rings or fused rings are linearly linked to each other. The host in the light-emitting sublayer can also be, but is not limited to, an aromatic compound having a long conjugation length in which benzene rings or fused rings are linearly linked to each other and having no pendant aromatic substituent on the molecular long axis. The absence of a pendant aromatic substituent on the molecular long axis allows dense molecular stacking, thereby facilitating carrier transfer. This can reduce the driving current of an element and improve the lifetime of the element. Use of a hydrocarbon compound only composed of carbon atoms and hydrogen atoms as the host can also improve the lifetime of an element. As a matter of course, the host may contain a heteroatom (such as N) in the molecule. With purity taken into account, the host can be an oligomer or a low-molecular-weight compound rather than a polymer.

One example of an aromatic compound in which benzene rings or fused rings are linearly linked to each other is a fluorene multimer in which a plurality of fluorene rings are linked to each other through positions 2 and 7 of the fluorene skeleton. This fluorene multimer is highly amorphous and has a glass transition temperature (Tg) as high as 120° C. or more. The fluorene multimer preferably has two to five fluorene skeletons. Part of the fluorene skeletons constituting the fluorene multimer may be substituted with a benzene ring or another fused ring (such as a naphthalene ring) provided that the benzene ring or the fused ring is linked to the skeletons through the positions on the long axis of the benzene ring or the fused ring.

The phrase "having no pendant aromatic substituent on the molecular long axis", as used herein, refers to the absence of an aromatic substituent, such as a carbazolyl group or an anthryl group, in directions other than the molecular long axis. For example, in the fluorene multimer described above, this phrase means that there is no aromatic substituent on positions 1, 4, 5, 8, and 9, excluding positions 2 and 7 and positions 3 and 6 of the fluorene ring on the molecular long axis.

In addition to the aromatic compounds described above, the host can be an organometallic complex, for example, of Al or Zn. Organometallic complexes have a smaller difference between the lowest excited singlet level (an excitation level after energy absorbed is relaxed (Stokes shift)) and the lowest excited triplet level than general organic compounds. In order to prevent the host from absorbing light emitted from the lowest excited triplet level of the dopant, the lowest excited triplet level of the host must be higher than the lowest excited triplet level of the final emitter, that is, the second dopant. As described above, organometallic complexes have a small difference between the lowest excited singlet level and the lowest excited triplet level. When the lowest excited triplet level of an organometallic complex approaches the lowest excited triplet level of the second dopant, the band gap of the host can be decreased. This can prevent the leakage of charges, such as holes and electrons, and energy diffusion from the lowest excited singlet level of the host to the excited singlet level of an adjacent material.

Specific examples of the host include, but are not limited to, the following compounds.

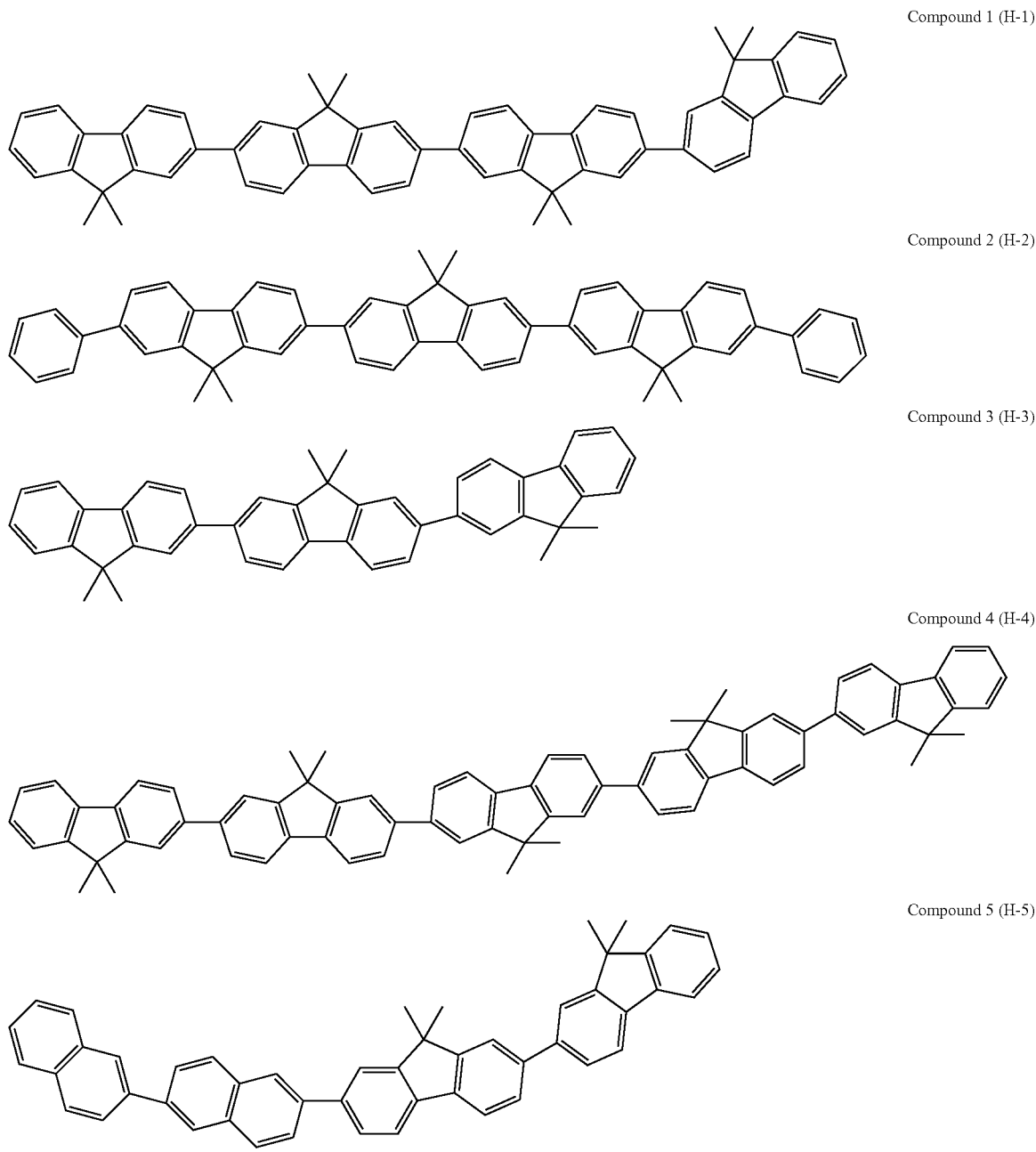

Compound 1 (H-1)

Compound 2 (H-2)

Compound 3 (H-3)

Compound 4 (H-4)

Compound 5 (H-5)

Compound 6 (H-6)
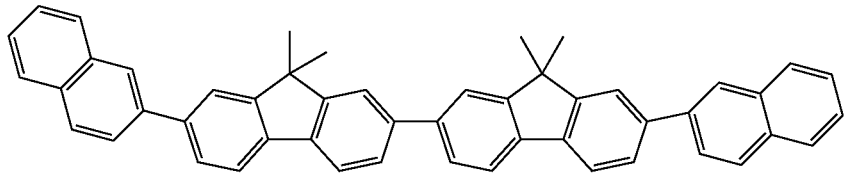
Compound 7 (H-7)
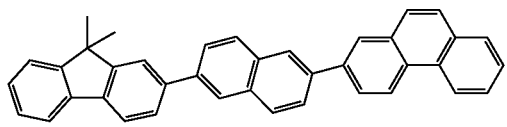
Compound 8 (H-8)
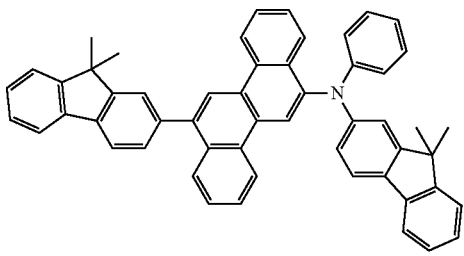
Compound 9 (H-9)
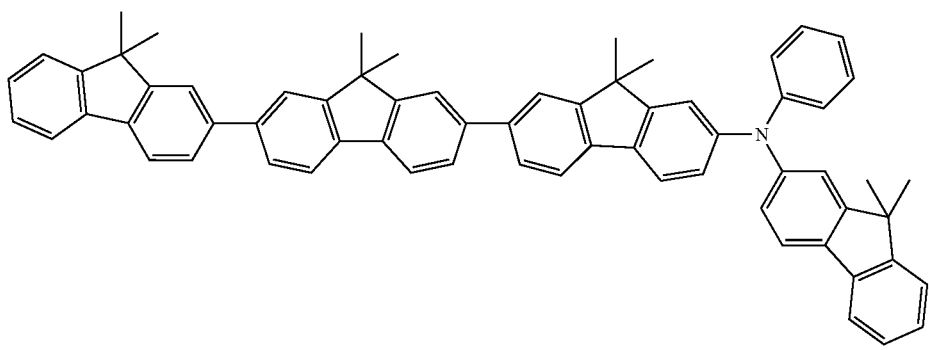
Compound 10 (H-10)
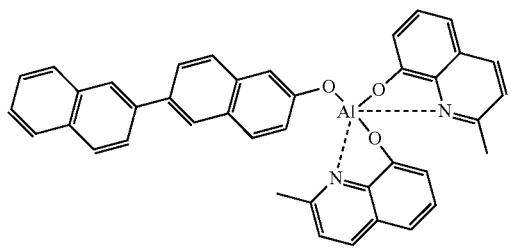
Compound 11 (H-11)
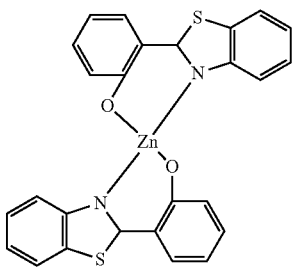
Compound 12 (H-12)
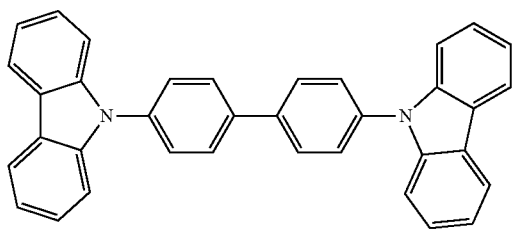
CBP The first dopant in the light-emitting sublayer is not intended to emit light but has the functions of (1) receiving energy from the host, (2) occurring intersystem crossing from the lowest excited singlet state to the lowest excited triplet state, and (3) supplying energy to the second dopant.

The first dopant is a metal complex having an unconjugated ligand and a conjugated ligand. The term "unconjugated ligand", as used herein, means that coordination sites of the ligand are weakly conjugated to a central metal. The term "weakly conjugated", as used herein, means that sites of a ligand that can coordinate to a central metal form an unconjugated structure in which double bonds and/or triple bonds are separated by a plurality of single bonds. Thus, the term "unconjugated ligand", as used herein, refers to a ligand that forms a weak π bond with a central metal.

For example, an acetylacetonate ligand and a phenylpyridine ligand are compared below. In the acetylacetonate ligand, two oxygen atoms coordinate to a central metal, such as Ir or Pt. On the other hand, in the phenylpyridine ligand, carbon atoms of the benzene ring and a nitrogen atom of the pyridine ring coordinate to a central metal. In the acetylacetonate ligand, the sites that can coordinate to a central metal do not form a conjugated structure. When the acetylacetonate ligand coordinates to a central metal, only one oxygen atom is substantially involved in the formation of a π bond between the ligand and the central metal. Thus, only one π bond is formed between the ligand and the central metal. In contrast, in the phenylpyridine ligand, the sites that can coordinate to a central metal form a conjugated structure. When the phenylpyridine ligand coordinates to a central metal, a nitrogen atom and a carbon atom are substantially involved in the formation of a π bond between the ligand and the central metal. Thus, two π bonds are formed between the ligand and the central metal. Hence, the acetylacetonate ligand forms a weak π bond between the ligand and a central metal, as compared with a ligand having a plurality of atoms that can coordinate to a metal atom to form a plurality of π bonds, such as phenylpyridine.

In an organometallic complex having a heavy-metal atom, such as Ir or Pt, as a central metal, a π bond between a ligand and the central metal affects the spin-orbit interaction of the central metal. A stronger interaction results in a larger transition moment from a triplet excited state to a ground state. This probably increases the emission rate constant and improves the quantum yield. The spin-orbit interaction decreases in proportion to the decrease in the number of π bonds. It is therefore believed that light emission using an unconjugated ligand, such as acetylacetonate, generally has a low quantum yield.

The first dopant has the lowest excited triplet level originating from the lowest excited level of an unconjugated ligand. In general, the lowest excited state of an organometallic complex having a central metal, such as Ir, is generated by transition from a d orbital of the central metal to a vacant orbital of a ligand. The unconjugated ligand of the first dopant has the lowest unoccupied molecular orbital (LUMO) lower than the LUMO of the other ligand. The LUMO of the unconjugated ligand can be lowered, for example, by (A) reducing the band gap of the unconjugated ligand, or (B) lowering the HOMO-LUMO of the unconjugated ligand relative to the vacuum level.

A specific method of (A) may involve the addition of a fused ring to the unconjugated ligand to form a conjugated structure in the ligand. A specific method of (B) may involve the addition of an electron-withdrawing group, such as fluorine, to the unconjugated ligand.

Use of such a first dopant allows triplet excitation energy required to emit phosphorescence to be efficiently transferred to the second dopant acting as the phosphorescent material. Furthermore, use of the first dopant allows only light emission of the second dopant to be observed. Even when green or blue light, which requires significant energy, is desired, use of such a first dopant can reduce light emission of undesired colors. This allows a wider choice of the second dopant.

The first dopant preferably has a relative emission intensity of 0.14 or less at room temperature with the emission intensity of $Ir(ppy)_3$ at room temperature being taken as 1. A small relative emission intensity of the first dopant facilitates the isolation of the light emission of the second dopant.

A light-emitting sublayer of an organic EL element according to the present invention contains 50% host by weight. Holes and electrons from a pair of electrodes are therefore likely to recombine in the host. Recombination of a hole and an electron in the host produces an excited host (a host in the lowest excited singlet state). The excitation energy of the excited host is not directly transferred from the lowest excited singlet state of the host to the lowest excited triplet state of the second dopant. The excitation energy is first transferred to the lowest excited singlet state of the first or second dopant. When the excitation energy has been transferred to the first dopant, intersystem crossing occurs from the lowest excited singlet state to the lowest excited triplet state. The excitation energy is then transferred from the lowest excited triplet level of the first dopant to the lowest excited triplet level of the second dopant.

Advantages of the inclusion of the first dopant in the light-emitting sublayer include the following (i) to (v).

(i) In case that the energy transfers from the lowest excited triplet state of the host to the first dopant, the light emission from the first dopant doesn't show, allowing a wider choice of the host.

(ii) The light emission of the first dopant is independent of the concentration of the first dopant. Thus, the advantages of the present invention can be obtained even at a relatively high concentration of the first dopant.

(iii) The advantages of the present invention can be obtained even when the difference between the lowest excited singlet state of the host and the lowest excited singlet state of the second dopant is large, thus allowing a wider choice of the second dopant.

(iv) The advantages of the present invention can be obtained even when the difference between the lowest excited singlet state of the host and the lowest excited triplet state of the second dopant is large, thus allowing a wider choice of the second dopant.

(v) Because intersystem crossing in the second dopant is not necessary, the advantages of the present invention can be obtained even when the difference between the lowest excited singlet state and the lowest excited triplet state of the second dopant is large. This allows a wider choice of the second dopant.

Owing to these advantages, after the specific structures of the host and the second dopant are determined, the first dopant can be appropriately determined to improve luminous efficiency.

The first dopant can contain a heavy-metal atom, such as platinum (Pt), copper (Cu), rhenium (Re), or iridium (Ir), as a central metal to cause intersystem crossing. In particular, the first dopant can contain a metal atom forming an octa-tetrahedral complex, such as iridium.

Specific examples of the first dopant include, but are not limited to, the following compounds.

Compound 13 (D1-1)

Compound 14 (D1-2)

Compound 15 (D1-3)

The second dopant can be formed of a phosphorescent material. Thus, excitation energy must be efficiently supplied to the lowest excited triplet state of the second dopant.

The phosphorescent material for the second dopant can be, but is not limited to, a metal complex. The metal complex for use in the second dopant can contain platinum, copper, rhenium, or iridium as a central metal. In particular, the metal complex can contain iridium as a central metal. A metal complex for use in the second dopant can contain a ligand having phenylisoquinoline or phenylquinoline as a main skeleton to achieve red-light emission and triplet energy transfer.

Specific examples of the second dopant include, but are not limited to, the following compounds.

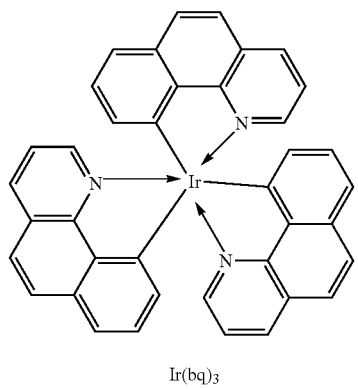

Ir(bq)$_3$ (D2-1)

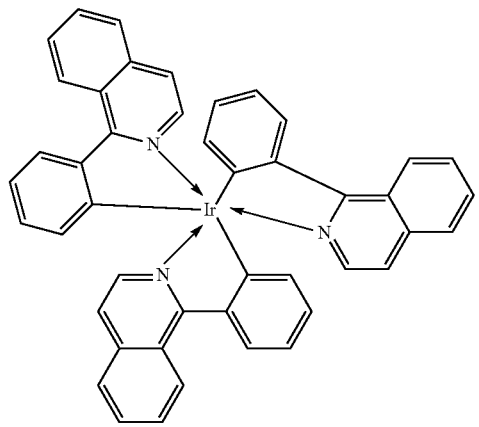

Ir(piq)$_3$ (D2-2)

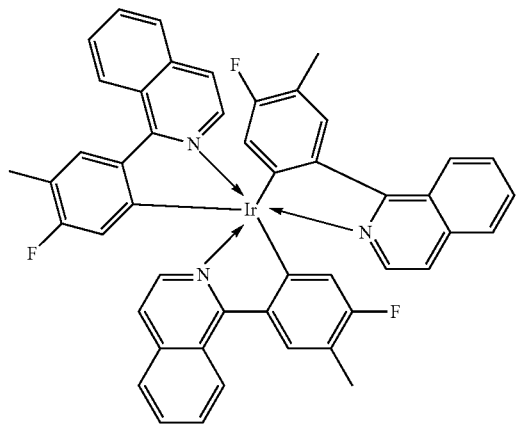

Ir(4F5mpiq)$_3$ (D2-3)

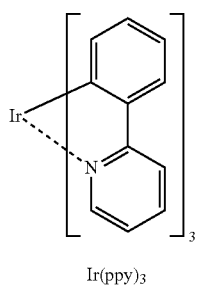

Ir(ppy)$_3$ (D2-4)

(D2-5)
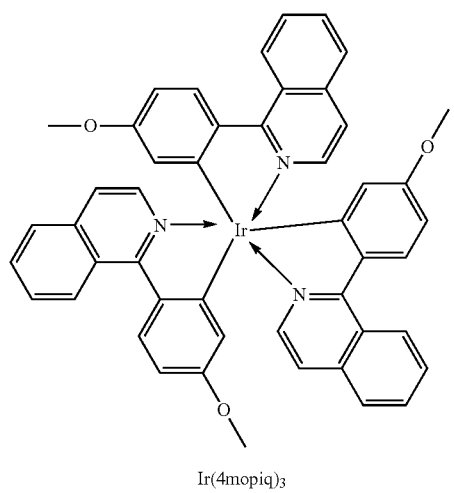
Ir(4mopiq)$_3$
(D2-8)
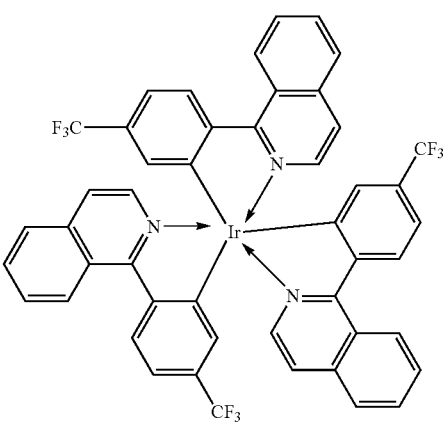
Ir(4CF$_3$piq)$_3$
(D2-6)
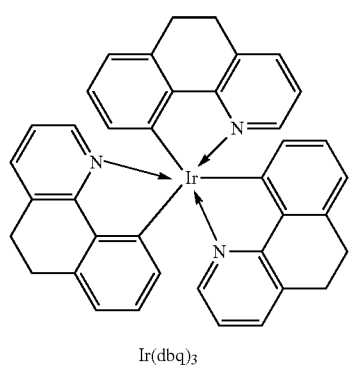
Ir(dbq)$_3$
(D2-9)
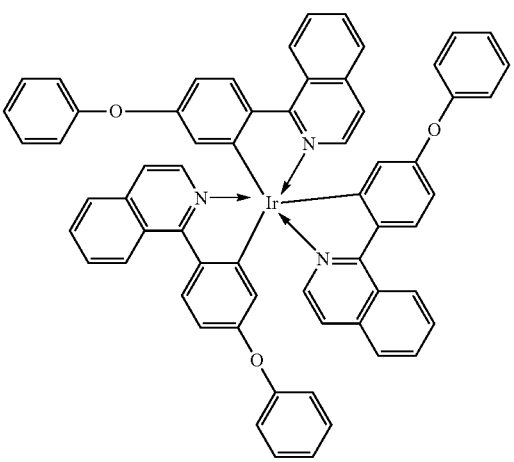
Ir(popiq)$_3$
(D2-7)
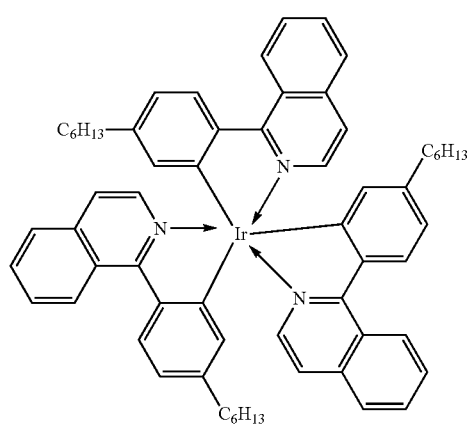
Ir(C$_6$piq)$_3$
(D2-10)
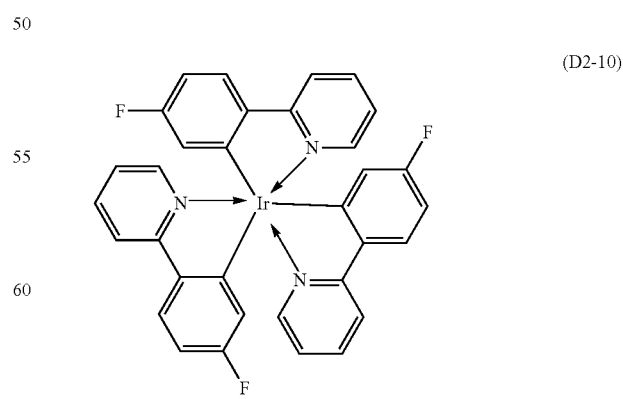
Ir(4Fppy)$_3$

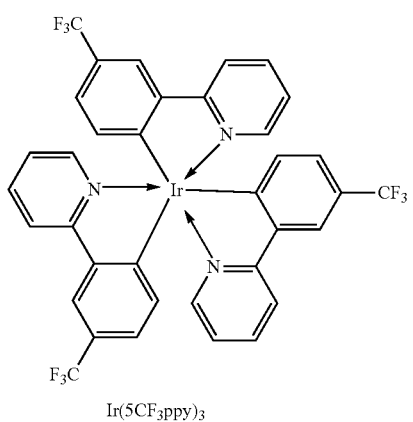
Ir(5CF₃ppy)₃ (D2-11)
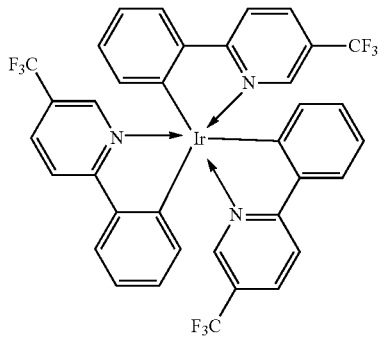
Ir(p-4CF₃-py)₃ (D2-12)
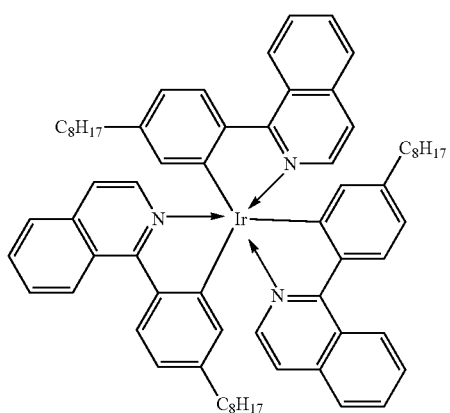
Ir(C₈piq)₃ (D2-13)
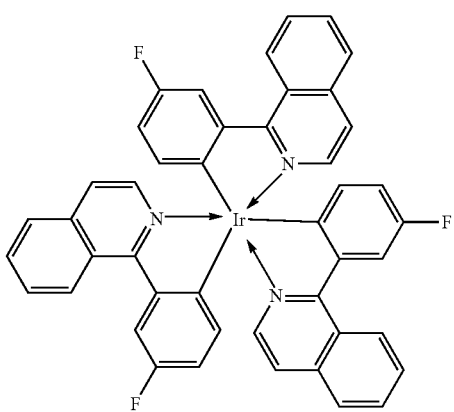
Ir(C₂piq)₃ (D2-14)
(D2-15)
Ir(5Fpiq)₃
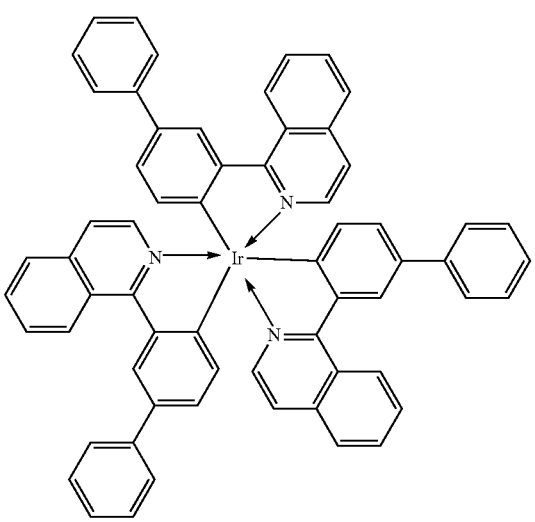
Ir(5ppiq)₃ (D2-16)

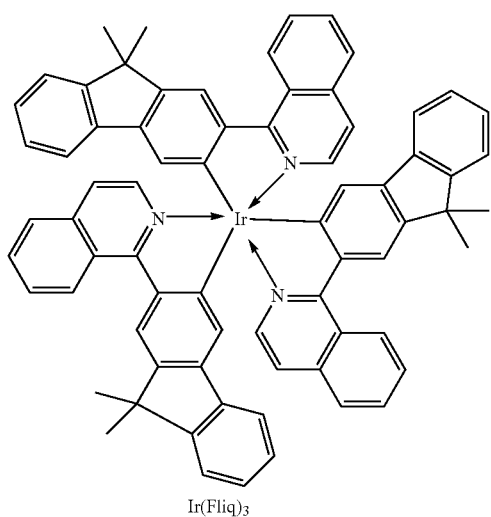
Ir(Fliq)₃
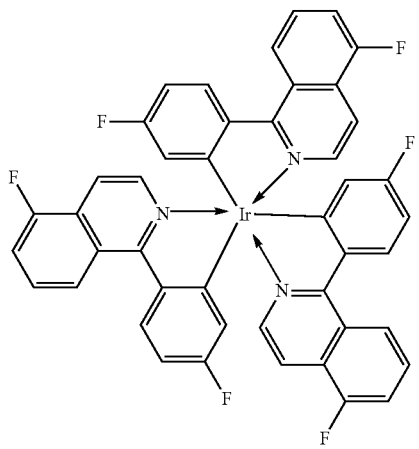
Ir(4Fp5Fiq)₃
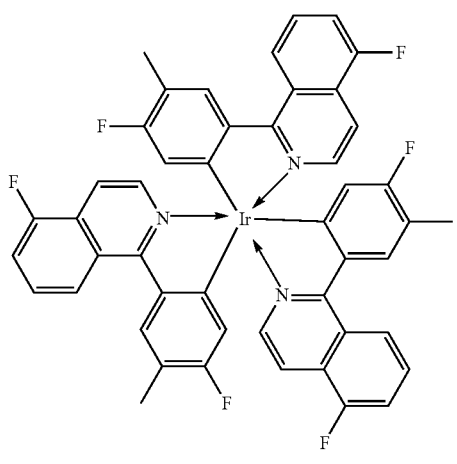
Ir(4F5Mp5Fiq)₃
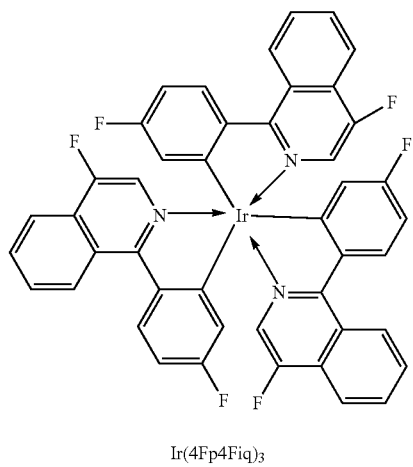
Ir(4Fp4Fiq)₃
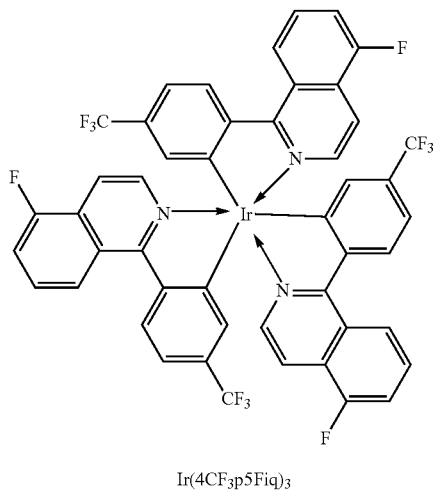
Ir(4CF₃p5Fiq)₃
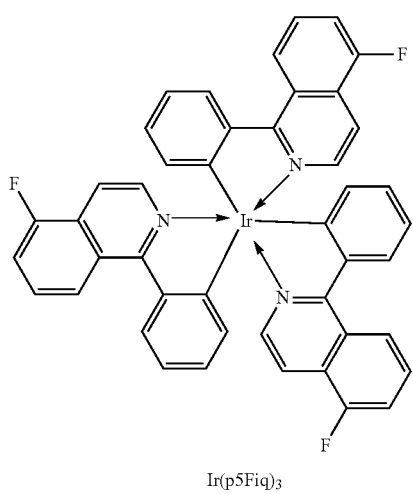
Ir(p5Fiq)₃

-continued (D2-23)

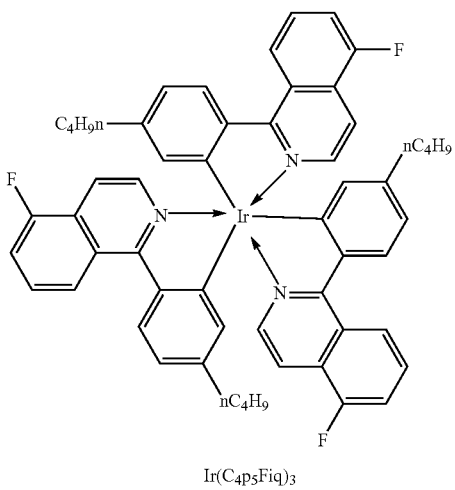

Ir(C4p5Fiq)3

(D2-24)

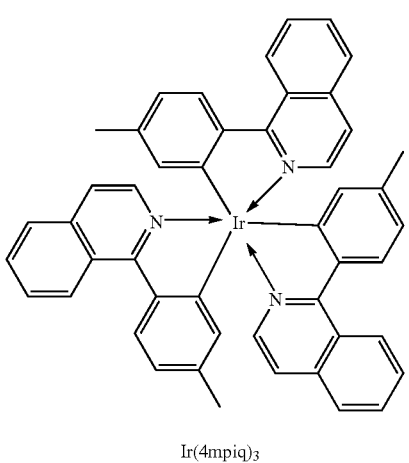

Ir(4mpiq)3

(D2-25)

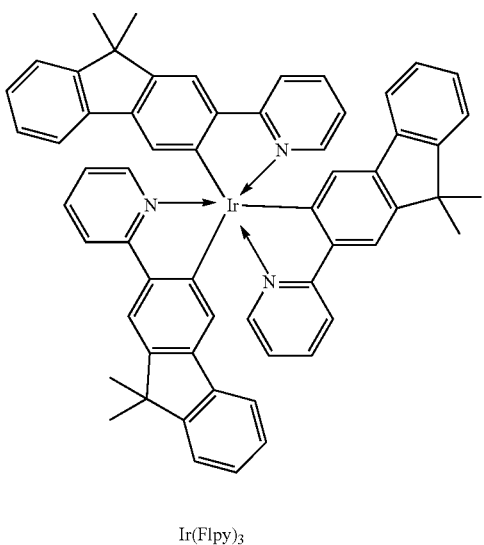

Ir(Flpy)3

-continued (D2-26)

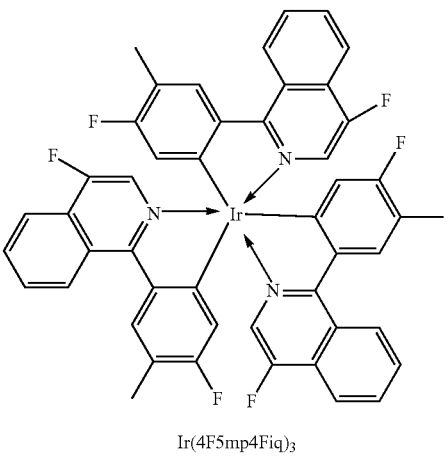

Ir(4F5mp4Fiq)3

The two dopants (the first dopant and the second dopant) in the light-emitting sublayer can contain the same central metal or a ligand having the same structure. The second dopant preferably has a phosphorescence lifetime of 1.6 μs or less. The longer the phosphorescence lifetime is, the higher the triplet excited state density of the second dopant is, resulting in the occurrence of T-T annihilation.

The dopants in the light-emitting sublayer are not limited to the two dopants described above (the first dopant and the second dopant). Provided that energy is efficiently transferred between the first dopant and the second dopant and that a dopant having a low triplet excitation level emits light, the light-emitting sublayer may contain another dopant (a third dopant or the like).

The amounts of the first dopant and the second dopant in the light-emitting sublayer are not particularly limited. The amount of the first dopant preferably ranges from 0.1% to 40%. The amount of the second dopant preferably ranges from 0.1% to 20%. The total amount of the first dopant and the second dopant is preferably 40% by weight or less.

An organic EL element according to the present invention can have a large overlap between the emission spectrum of the host and the absorption spectrum of the first dopant and/or the absorption spectrum of the second dopant. When the overlap is large, the two dopants can absorb the excitation energy of the host with a minimum of waste, and the second dopant can efficiently emit light.

FIGURE is a schematic view illustrating the relationship between the lowest excited levels of the materials contained in the light-emitting sublayer. The excitation energy of the first dopant is transferred to the second dopant. In order to transfer energy from the first dopant to the second dopant, the lowest excited triplet level of the first dopant must be higher than the lowest excited triplet level of the second dopant. The lowest excited triplet level of the host may be lower or higher than the lowest excited triplet level of the first dopant. In general, the lowest excited triplet level of the host can be lower than the lowest excited triplet level of the first dopant. This can reduce the band gap of the host and increase an electric current to the light-emitting sublayer, thereby reducing power consumption.

The lowest excited singlet state $S_{H1}$ of the host can be higher than the lowest excited singlet state $S_{D2-1}$ of the second dopant.

Other components of an organic EL element according to the present invention will be described below. The electrodes of an organic EL element according to the present invention are metal electrodes or transparent electrodes. At least one of the electrodes can be a transparent electrode. The materials of the electrodes are appropriately determined in consideration of electron injection and hole injection. The transparent electroconductive material of the transparent electrode may be ITO or IZO. The metallic material of the metal electrode may be aluminum, gold, platinum, chromium, or copper. These metallic materials can be used alone or as an alloy thereof.

In the case that an organic compound layer of an organic EL element according to the present invention includes a charge-transport sublayer (a hole-transport sublayer or an electron-transport sublayer) or a charge-injection sublayer (a hole-injection sublayer or an electron-injection sublayer), the charge-transport sublayer or the charge-injection sublayer may be formed of a known material. More specifically, the hole-transport sublayer or the hole-injection sublayer may be formed of a known hole-transport or hole-injection material. Likewise, the electron-transport sublayer or the electron-injection sublayer may be formed of a known electron-transport or electron-injection material.

If necessary, an organic EL element according to the present invention can be isolated from oxygen and/or water. For example, a sealed housing or a sealing film formed of an organic and/or inorganic material may be used.

In particular, an organic EL element according to the present invention can be used as a red-light-emitting element. Depending on the luminescent color of the second dopant, an organic EL element according to the present invention can be used as a green or blue organic EL element. Depending on the combination of the materials of the second dopant, an organic EL element according to the present invention can be used as a white organic EL element.

An organic EL element according to the present invention can be uses as a component of display apparatuses, such as displays. For example, an organic EL element according to the present invention can be used for pixels or sub-pixels of displays. Examples of the displays include display apparatuses for television sets, personal computers, digital cameras, and camcorders, and onboard display apparatuses. An organic EL element according to the present invention may be used for illumination, as a display for electrophotographic image-forming apparatuses, or as an exposure light source for photosensitive members.

An organic EL element according to the present invention may be used in display and other apparatuses as a single organic EL element or combined organic EL elements. A plurality of organic EL elements are driven, for example, in a passive mode or an active-matrix mode. A plurality of organic EL elements may have the same luminescent color or different luminescent colors. A plurality of luminescent colors from organic EL elements allow light emission in full color. An organic EL element according to the present invention may have a bottom emission structure in which light is emitted through a substrate or a top emission structure in which light is emitted through the side opposite to the substrate.

EXAMPLES

First Dopant

In Examples and Comparative Example described below, the following compounds were used as the first dopants.

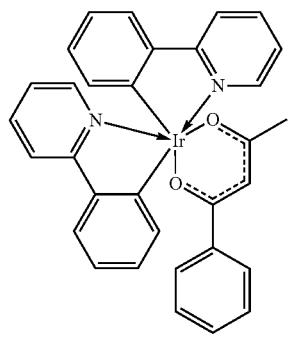

D1-1

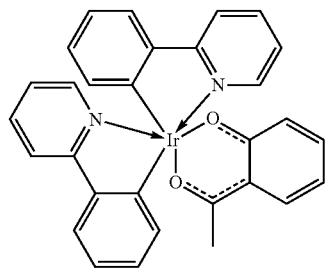

D1-2

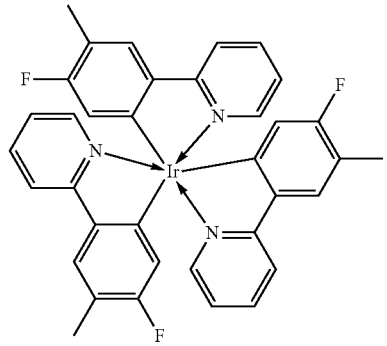

Compound α

The emission intensity of the first dopant was measured by the method described below.

A toluene solution of a test compound (concentration: $10^{-5}$% by mole) was injected into a quartz cell. Nitrogen gas was bubbled for 10 minutes to remove residual oxygen. The degassed solution was irradiated with Xe light (wavelength: 400 nm). The emission spectrum was measured at room temperature with a spectrophotometer (manufactured by Hitachi High-Technologies Co.). The absorption spectrum of the same solution was measured with an ultraviolet-visible spectrophotometer (manufactured by JASCO Co., V-560). A value according to the following equation was determined from the emission spectrum and the absorption spectrum thus measured.

Value=(Integral of emission intensities in the range of 470 to 670 nm)/(Absorption intensity at 400 nm)  [Equation 1]

The emission spectrum and the absorption spectrum of Ir(ppy)$_3$ were also measured in the same manner, and a value according to the above-mentioned equation was determined. Relative values for the first dopants were then determined from the calculated values with the value for Ir(ppy)$_3$ being taken as 1. Table 1 shows the results. The relative values in Table 1 correspond to emission intensities relative to the emission intensity of Ir(ppy)$_3$.

TABLE 1

| First dopant | Relative value (Ir(ppy)$_3$ = 1) |
|---|---|
| Exemplary compound D1-1 | 0.14 |
| Exemplary compound D1-2 | 0.001 |
| Compound α | 0.82 |

The molecular orbitals of the compounds D1-1 and D1-2 were simulated in accordance with currently widely used Gaussian 03 (Gaussian 03, Revision D. 01, M. J. Frisch, G. W. Trucks, H. B. Schlegel, G. E. Scuseria, M. A. Robb, J. R. Cheeseman, J. A. Montgomery, Jr., T. Vreven, K. N. Kudin, J. C. Burant, J. M. Millam, S. S. Iyengar, J. Tomasi, V. Barone, B. Mennucci, M. Cossi, G. Scalmani, N. Rega, G. A. Petersson, H. Nakatsuji, M. Hada, M. Ehara, K. Toyota, R. Fukuda, J. Hasegawa, M. Ishida, T. Nakajima, Y. Honda, O. Kitao, H. Nakai, M. Klene, X. Li, J. E. Knox, H. P. Hratchian, J. B. Cross, V. Bakken, C. Adamo, J. Jaramillo, R. Gomperts, R. E. Stratmann, O. Yazyev, A. J. Austin, R. Cammi, C. Pomelli, J. W. Ochterski, P. Y. Ayala, K. Morokuma, G. A. Voth, P. Salvador, J. J. Dannenberg, V. G. Zakrzewski, S. Dapprich, A. D. Daniels, M. C. Strain, O. Farkas, D. K. Malick, A. D. Rabuck, K. Raghavachari, J. B. Foresman, J. V. Ortiz, Q. Cui, A. G. Baboul, S. Clifford, J. Cioslowski, B. B. Stefanov, G. Liu, A. Liashenko, P. Piskorz, I. Komaromi, R. L. Martin, D. J. Fox, T. Keith, M. A. Al-Laham, C. Y. Peng, A. Nanayakkara, M. Challacombe, P. M. W. Gill, B. Johnson, W. Chen, M. W. Wong, C. Gonzalez, and J. A. Pople, Gaussian, Inc., Wallingford Conn., 2004) using a DFT basis function 6-31+G* calculation technique. This method includes a calculation error and is, strictly speaking, inaccurate. However, this method was proved to provide a helpful guideline for molecular designing. The simulation showed that the LUMO of the compounds was localized to the acetylacetonate ligand side and that the lowest excited triplet level was assigned to the transition from Ir to the acetylacetonate ligand.

The relative value for the compound D1-3 was also determined in the same way as in the compounds D1-1 and D1-2. The relative value (the emission intensity relative to the emission intensity of Ir(ppy)$_3$) was 0.005.

Example 1

An organic EL element was fabricated by the method described below. The organic EL element included a transparent electrode (anode), a hole-transport sublayer, a light-emitting sublayer, an electron-transport sublayer, and a cathode on a transparent substrate in this order.

An ITO film was formed on a glass substrate (transparent substrate) by sputtering. The ITO film had a thickness of 100 nm. The ITO film was patterned by photolithography to prepare a plurality of transparent electrodes each having an electrode area of 3 mm$^2$. An organic compound layer and an electrode layer described below were continuously formed on the ITO electrode (transparent electrode) by vacuum evaporation using resistance heating in a vacuum chamber at 10$^{-5}$ Pa. Table 2 shows the types, the materials, and the thicknesses of the organic compound layer and the electrode layer.

TABLE 2

|  | Material | Thickness [nm] |
|---|---|---|
| Hole-transport sublayer | Compound β | 20 |
| Light-emitting sublayer | CBP (Host) | 50 |
|  | D1-1 (First dopant) |  |
|  | Ir(4F5mpiq)$_3$ (Second dopant) |  |
|  | Host:First dopant:Second dopant = |  |
|  | 88:10:2 (weight ratio) |  |
| Electron-transport sublayer | Bphen | 30 |
| First metal electrode (anode) | KF | 1 |
| Second metal electrode (cathode) | Al | 100 |

The following are the structural formulae of the materials except KF and Al.

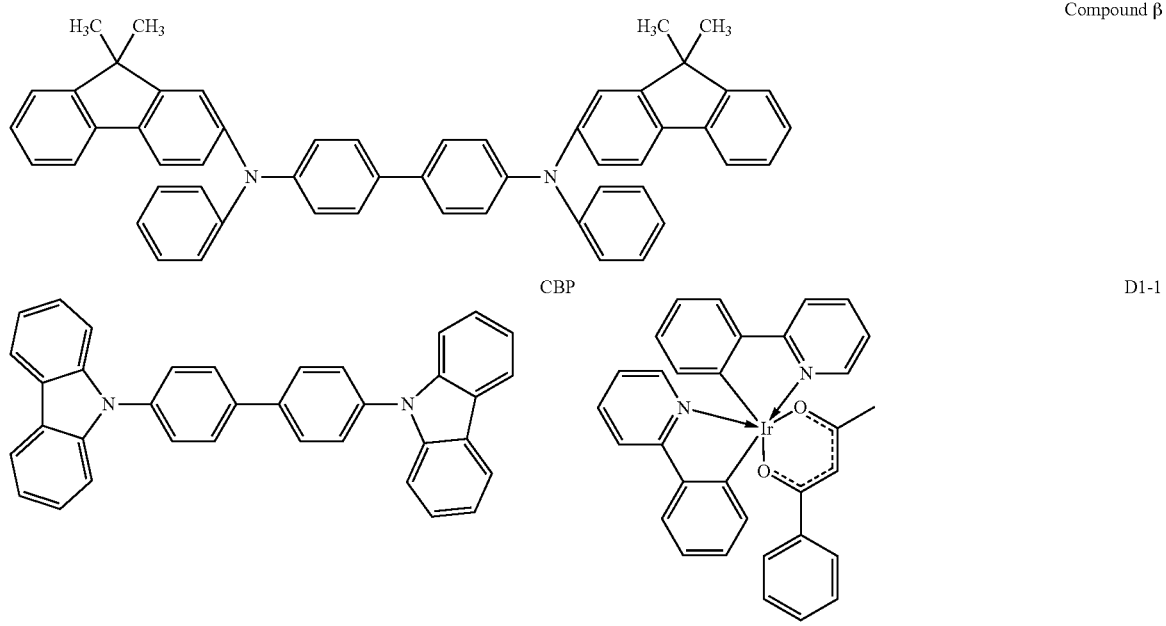

-continued

Ir(4F5mpiq)₃

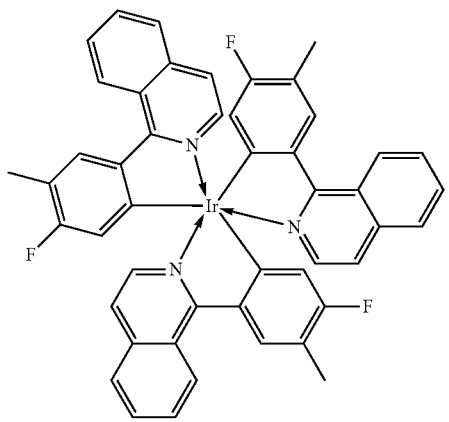

Bphen

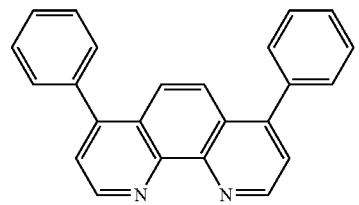

Through these processes, an organic EL element was fabricated. The luminous efficiency of the organic EL element was measured at a luminance of 600 cd/m². The chromaticity for the organic EL element was measured with BM-7 manufactured by Topcon Co. Table 3 shows the results.

Example 2

An organic EL element was fabricated in the same way as in Example 1 except that the first dopant in the light-emitting sublayer was changed from D1-X to D1-Y. The organic EL element was evaluated in the same way as in Example 1. Table 3 shows the results.

Example 3

An organic EL element was fabricated in the same way as in Example 1 except that the second dopant in the light-emitting sublayer was changed from Ir(4F5 mpiq)₃ to Ir(ppy)₃. The organic EL element was evaluated in the same way as in Example 1. Table 3 shows the results.

Comparative Example 1

An organic EL element was fabricated in the same way as in Example 1 except that the first dopant in the light-emitting sublayer was changed from D1-X to a compound Z. The organic EL element was evaluated in the same way as in Example 1. Table 3 shows the results.

TABLE 3

|  | Luminous efficiency [cd·A] | Chromaticity [CIE(x, y)] |
| --- | --- | --- |
| Example 1 | 12 | 0.64, 0.36 |
| Example 2 | 10 | 0.64, 0.36 |
| Example 3 | 7 | 0.68, 0.32 |
| Comparative example 1 | 13 | 0.49, 0.48 |

Table 3 shows that use of a compound having a low emission intensity as the first dopant results in efficient energy transfer. The first dopant in the light-emitting sublayer of an organic EL element according to the present invention has a low emission intensity. Even the first dopant at a higher concentration than the second dopant in the light-emitting sublayer therefore does not emit light, allowing the target chromaticity to be achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-215403 filed Sep. 17, 2009, which is hereby incorporated by reference herein in its entirety.

What is claimed is:

1. An organic EL element comprising:
   an anode and a cathode; and
   an organic compound layer between the anode and the cathode, the organic compound layer including a light-emitting sublayer,
   wherein the light-emitting sublayer contains a host, a metal complex acting as a first dopant, and a metal complex acting as a second dopant,
   the metal complex acting as the first dopant includes an unconjugated ligand and a conjugated ligand, and
   the first dopant has the lowest excited triplet level originating from the lowest excited triplet level of an unconjugated ligand.

2. An organic EL element comprising:
   an anode and a cathode; and
   an organic compound layer between the anode and the cathode, the organic compound layer including a light-emitting sublayer,
   wherein the light-emitting sublayer contains a host, a metal complex acting as a first dopant, and a metal complex acting as a second dopant, and
   the first dopant has a relative emission intensity of 0.14 or less at room temperature with the emission intensity of Ir(ppy)₃ at room temperature being taken as 1.

3. The organic EL element according to claim 2, wherein the second dopant comprises a phosphorescent material.

4. The organic EL element according to claim 3, wherein the first dopant and the second dopant comprise Ir or Pt as a central metal.

* * * * *